United States Patent [19]

Zappala

[11] 4,247,805
[45] Jan. 27, 1981

[54] CIRCUIT FOR DRIVING SAW-TOOTH CURRENT IN A COIL

[75] Inventor: Giuseppe Zappala, Turin, Italy

[73] Assignee: Indesit Industria Elettrodomestici Italiana, Italy

[21] Appl. No.: 41,912

[22] Filed: May 23, 1979

[30] Foreign Application Priority Data

Jun. 8, 1978 [IT] Italy ............................... 68328 A/78

[51] Int. Cl.³ .............................................. H01J 29/70
[52] U.S. Cl. ...................................... 315/408; 315/407
[58] Field of Search ................................. 315/407, 408

[56] References Cited

U.S. PATENT DOCUMENTS

| 3,950,674 | 4/1976 | Joosten et al. | 315/407 X |
| 4,099,101 | 7/1978 | Teuling | 315/408 |
| 4,153,862 | 5/1979 | Lim | 315/408 |
| 4,162,433 | 7/1979 | Van Hattum | 315/408 X |

*Primary Examiner*—Malcolm F. Hubler

*Attorney, Agent, or Firm*—Ostrolenk, Faber, Gerb & Soffen

[57] ABSTRACT

A circuit for driving a saw-tooth current in a coil includes a deflection circuit formed by the coil connected in parallel with a retrace capacitor and in series with a trace capacitor. The deflection circuit is connected in parallel with a first diode which conducts during the first half of the trace interval and in parallel with a second diode connected in series with a controllable switch which conducts during the second half of the trace interval. While the transistor is conductive, current flows through an inductor connected in series with it. The energy stored in this inductor is transferred at a subsequent stage partly to the deflection circuit and partly to a further capacitor. The further capacitor subsequently itself transfers the charge stored in it through a second inductor and a fourth diode to the deflection circuit so that at no time is energy dissipated in a load.

6 Claims, 2 Drawing Figures

CIRCUIT FOR DRIVING SAW-TOOTH CURRENT IN A COIL

BACKGROUND OF THE INVENTION

The present invention relates to a circuit arrangement for driving a saw-tooth current, having a trace and retrace interval, in a coil, in particular, a deflection coil of a television cathode ray tube.

A circuit arrangement of this kind is described by A. Farina and G. Zappala in an article entitled "Self-stabilized horizontal deflection circuit", published in the 1976 n.6 issue of the "Elettronica e Telecomunicazioni" magazine, pages 237–241.

The arrangement comprises a retrace capacitor and a trace capacitor connected to the coil so as to form a deflection circuit which oscillates freely during the retrace interval, a first diode connected in parallel with the deflection circuit and having such polarity as to be made conductive by the saw-tooth current flowing through the coil during the first part of the trace interval, a second diode connected in parallel with the deflection circuit and having such polarity as to be made conductive by the saw-tooth current during the second part of the trace interval, a controllable switch having a control electrode, connectable to a periodic control signal source so as to be rendered conductive during part of the trace interval, and connected via a first inductor to a supply source such that, during the part of the said trace interval in which the said switch is conductive, energy is stored in the said first inductor, and means for transferring the energy stored in the first inductor partly to the said deflection circuit, via a third diode and partly to a further capacitor during the part of the interval in which the said switch is not conductive.

The circuit described in this article dissipates part of the energy picked up by a relatively high voltage supply source (220 V) in a relatively low voltage auxiliary load circuit (12 and 24 V).

BRIEF SUMMARY OF THE INVENTION

The present invention seeks to overcome the need for dissipating part of the energy picked up by the supply source in an auxiliary load.

According to the present invention there is provided a circuit arrangement for driving a saw-tooth current, having a trace and retrace interval, in a coil, the arrangement comprising a retrace capacitor and a trace capacitor connected to the said coil so as to form a deflection circuit operative to oscillate freely during the retrace interval, a first diode connected in parallel with the said deflection circuit and having such polarity as to be rendered conductive by the saw-tooth current during the first part of the trace interval, a series combination formed of a second diode and a semiconductor switch connected in parallel with the said deflection circuit, the second diode being of such polarity as to be rendered conductive by the saw-tooth current during the second part of the trace interval, a periodic control signal source connected to the control electrode of the semiconductor switch to render the latter switch conductive during part of the trace interval, a first inductor connected in series with the simiconductor switch across a current supply source so that, during the part of the said trace interval in which the said switch is conductive, energy is stored in the said first inductor, and means including a third diode for transferring the said energy stored in the first inductor, partly to the said deflection circuit, and partly to a further capacitor during the part of the saw-tooth cycle in which the said switch is not conductive, means being further provided for transferring the energy stored in the further capacitor at a subsequent stage in the saw-tooth cycle to the said deflection circuit.

BRIEF DESCRIPTION OF THE DRAWINGS

The invention will now be described further, by way of example, with reference to the accompanying drawings, in which.

DETAILED DESCRIPTION OF THE INVENTION

Figure 1:
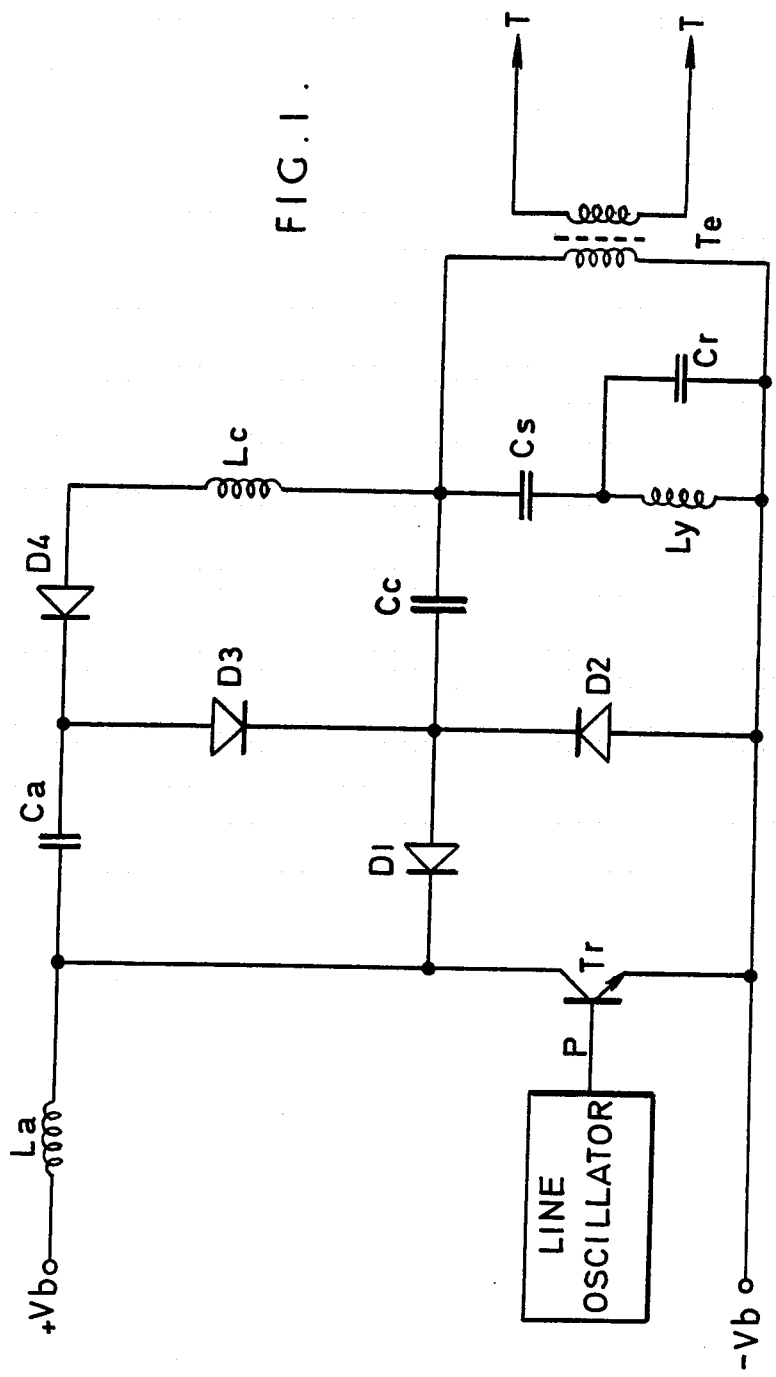
FIG. 1 shows a circuit for driving saw-tooth current in a television cathode ray tube deflection coil according to the present invention.

FIG. 1 shows the diagram of a circuit for driving saw-tooth current in a deflection coil Ly. A circuit of this type is suitable, for example, as the line output stage of a television receiver.

A d.c. voltage supply source (e.g. obtained by rectifying and filtering the 220 V a.c. supply voltage) is connected to the terminals marked +Vb and −Vb in FIG. 1.

A suitable control signal is applied to the base of transistor Tr (type BU 205, for example) in the form of a rectangular signal repeated at line frequency for a length of time ranging from 27 to 51 microseconds (to make things clearer, let us say 32 microseconds). This signal is derived from the line oscillator of the television receiver.

Deflection coil Ly (line deflection coil) is connected in parallel with a capacitor Cr (retrace capacitor) and in series with a capacitor Cs (trace capacitor) of much higher capacitance. Parallel to the circuit formed by Ly, Cr and Cs, which for the sake of brevity will be referred to hereafter as the deflection circuit, is connected the primary winding of a transformer Te. This has one or more secondary windings (only one is shown in FIG. 1 with two terminals T-T) for supplying auxiliary loads (e.g. the extra high voltage (E.H.T.) circuit or low voltage circuits in the television receiver).

A first diode D2 is connected parallel to the deflection circuit by way of a capacitor Cc, the polarity of the diode being such as to be rendered conductive by the deflection current during the first part of the saw-tooth trace interval. Parallel to diode D2 are connected a second diode D1 and the emitter-collector path of a transistor Tr connected in series. The polarity of diode D1 is such that the deflection current makes it conductive during the second part of the saw-tooth trace interval.

The collector of transistor Tr is connected to the +Vb positive pole of the supply source via a first inductor La.

The negative pole −Vb of the supply source is connected to the emitter of the transistor as well as to diode D2 and the deflection circuit.

One terminal of a capacitor Ca is connected to the collector of transistor Tr. The cathode of a third diode D3 is connected to the junction of diodes D1, D2 and capacitor Cc. The anode of D3 is connected to the other terminal of capacitor Ca and to the cathode of a fourth diode D4 the anode of which is connected, via a second inductor Lc, to the junction of capacitors Cc and Cs as well as to the primary winding of transformer Te.

Figure 2:
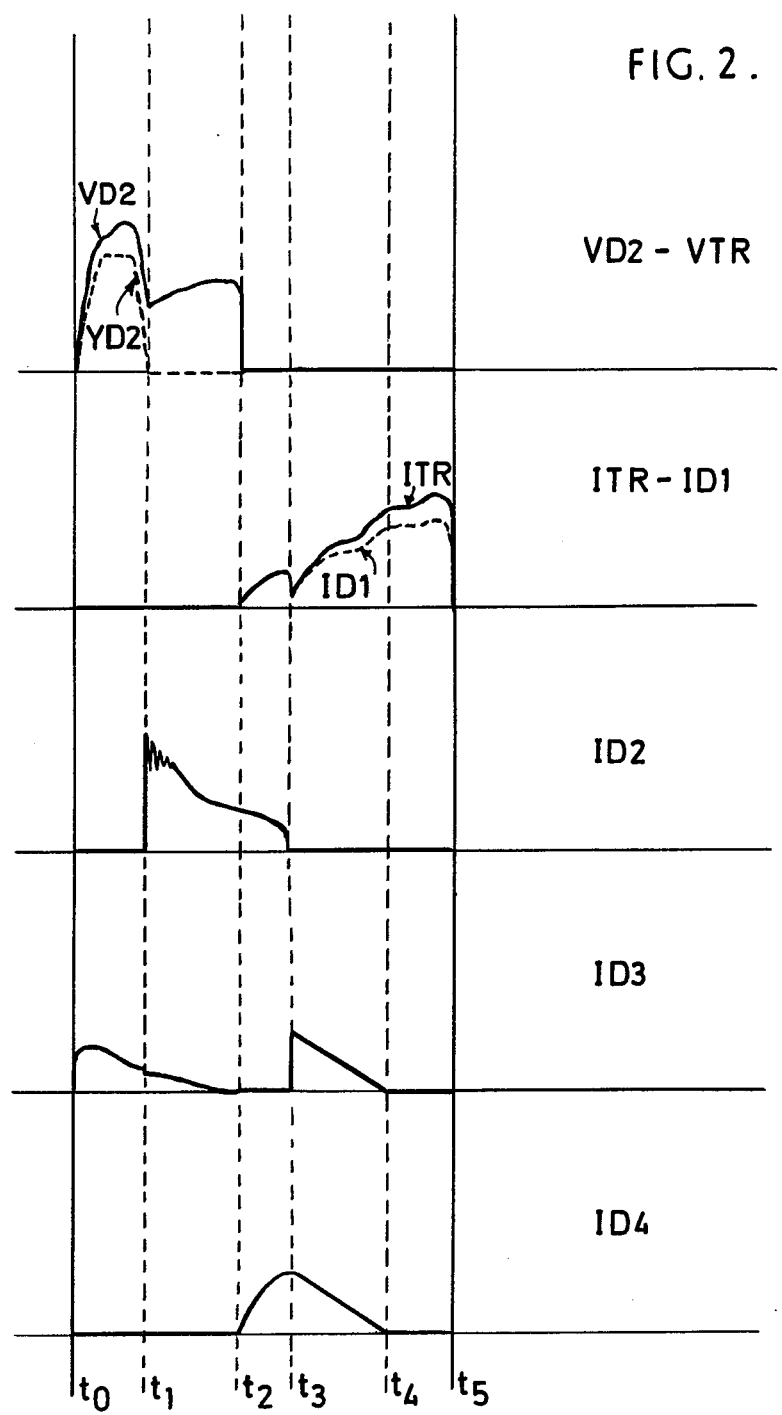
FIG. 2 shows the voltage and current curves at main points in the FIG. 1 circuit to give a clearer understanding of how the circuit operates.

Operation of the FIG. 1 circuit will now be described with reference to the FIG. 2 diagrams (for a clearer view of the voltage and current curves, these are not drawn to scale). In FIG. 2, the top graph shows the voltage (VTR) between the collector and emitter of transistor Tr and the voltage (dotted line VD2) present at the terminals of diode D2. The second graph shows the current (ITR) in the collector circuit of transistor Tr and the current (dotted line ID1) in diode D1. The third graph shows the current (ID2) in diode D2, the fourth graph shows the current (ID3) in diode D3 and the fifth graph shows the current (ID4) in diode D4.

The time axis, common to all the graphs, is divided into five intervals and marked off into six successive instants ($t_0 \ldots t_5$). The instant $t_0$ corresponds to the end of the trace interval and the start of the retrace interval. At this point, transistor Tr stops conducting as a result of the control signal applied to its base P. Consequently, during the retrace interval ($t_0$–$t_1$), both D1 and D2 are con-conductive so that the deflection circuit oscillates freely and, at the terminals of diode D2, a half wave (more or less semi-sinusoidal) of positive voltage is developed (see the top graph of FIG. 2).

At $t_1$, the voltage at the terminals of diode D2 is inverted so as to make diode D2 conductive. This marks the end of the retrace and the start of the trace interval in that capacitor Cs is now connected to the terminals of the deflection coil Ly (and Cr). The high capacitance of capacitor Cs imposes a more or less steady curve on the current flowing in deflection coil Ly. The effect of capacitor Cc has been ignored because its capacitance is even higher than that of capacitor Cs. During the interval $t_1$–$t_2$ (start of the trace interval) the deflection current (circulating in Ly) flows through D2 (see the third graph ID2 in FIG. 2).

In the meantime, the energy which had been stored in inductor La during the second part of the previous cycle when transistor Tr was conductive, flows in the form of current throughout the interval $t_0$–$t_1$ and for the first part of interval $t_1$–$t_2$ (retrace and start of trace interval) through capacitor Ca for charging capacitor Cc, at least up to instant $t_1$ (see the fourth graph, current in diode D3, in FIG. 2). Correspondingly, capacitor Ca is also charged so that the voltage at the terminals of transistor Tr is equal to the sum of the voltages at the terminals of diode D2 and the series connection of the capacitor Ca and diode D3 (see the first graph in FIG. 2).

At the instant $t_2$, transistor Tr is made conductive by the control pulse applied to its base P. Diode D4 is also made conductive while capacitor Ca commences discharging through D2, Cc, Lc, D4 and Tr. Capacitor Ca continues discharging up to $t_3$ (see the second and fifth graphs, for example, in FIG. 2). At the same instant, $t_3$, diode D3 is made conductive and, instead of discharging capacitor Ca, the current in inductor Lc charges capacitor Cc through diode D3. The effect of this is that, at the same instant, the current in D2 is stopped and diode D1 starts conducting (see graphs two, three, four and five in FIG. 2). This switch between diodes D2 and D1 is the result of two factors:

the deflection current circulating at instant $t_3$ changes its sign;

the voltage at the terminals of diode D3 is inverted.

During the interval $t_3$–$t_4$, the current in inductor Lc and diodes D3 and D4 falls gradually down to zero (see the fourth and fifth graphs in FIG. 2). The current in D1 and Tr, on the other hand, increases more or less gradually. The current in transistor Tr is higher than that in diode D1 as it also includes the current flowing in inductor La (see the second graph in FIG. 2). During the interval $t_4$–$t_5$, only diode D1 and transistor Tr are conductive (see FIG. 2). Capacitor Ca is completely discharged as the voltage at its terminals was zero throughout the interval $t_3$–$t_4$ when both diodes D1 and D3 were conductive after which it was isolated during the interval $t_4$–$t_5$ when both D3 and D4 were non-conductive. At instant $t_5$, transistor Tr is once again made conductive by the control signal applied to its base P and the cycle recommences with the start of a new retrace interval. At instant $t_5$ (or $t_0$), diode D3 is once again made conductive but no sharp rise in voltage occurs at the terminals of the collector-emitter section of transistor Tr as capacitor Ca is run discharged.

From this description, it will be clear that the energy stored in inductor La during the trace interval $t_2$–$t_5$ in which Tr is conductive is partly supplied, during the retrace interval ($t_0$–$t_1$) to capacitor Cc, via capacitor Ca and diode D3, and partly stored in the same Ca during interval $t_0$–$t_2$.

The energy stored in capacitor Ca is mainly supplied later, during the interval $t_2$–$t_3$, to inductor Lc from which it is transferred, during the interval $t_3$–$t_4$, to capacitor Cc. The energy supplied each cycle to inductor La is therefore transferred in the next cycle to capacitor Cc which acts as an energy store for the deflection circuit and auxiliary loads supplied by transformer Te.

The voltage at the terminals of diode D2 (and, consequently, also the deflection current and auxiliary supplies picked up by transformer Te) can easily be stabilized, that is, to make them unaffected by variations in supply voltage Vb or load, by sampling the voltage at the terminals of D2, in the known way, and checking, against this, the conduction time of transistor Tr, that is, the length of the control pulse applied to electrode P.

Rating Table of main parts on the FIG. 1 circuit:
La = 20 mH
Ca = 6.8 nF
Lc = 4.3 mH
Ly = 2.2 mH
Cs = 0.33 uF
Cc = 2.2 μF The advantages of the circuit arrangement according to the invention will be clearly seen from the description given. To those skilled in the art, it will be clear that variations can be made to the circuit described without, however, departing from the scope of the present invention.

I claim:

1. A circuit arrangement for driving a saw-tooth current, having a trace and retrace interval, in a coil, the arrangement comprising: a retrace capacitor and a trace capacitor connected to said coil so as to form a deflection circuit operative to oscillate freely during the retrace interval; a first diode connected in parallel with said deflection circuit and having such polarity as to be rendered conductive by the saw-tooth current during a first part of the trace interval; a series combination formed of a second diode and a semiconductor switch connected in parallel with said deflection circuit, the second diode being of such polarity as to be rendered conductive by the saw-tooth current during a second part of the trace interval; a periodic control signal source connected to the control electrode of the semiconductor switch to render the latter switch conductive during part of the trace interval; a first inductor connected in series with the semiconductor switch across a current supply source so that, during the part of said trace interval in which said switch is conductive, energy is stored in said first inductor; and first means including a third diode for transferring said energy stored in the first inductor partly to said deflection circuit and partly to a storage capacitor during the part of the saw-tooth cycle in which said switch is not conductive; and second means for transferring substantially all of the energy stored in said storage capacitor to said deflection circuit at a subsequent stage in the saw-tooth cycle.

2. A circuit arrangement according to claim 1, in which said second means comprises a second inductor and a fourth diode, the energy transferred to said storage capacitor being frist transferred to the second inductor and subsequently to said deflection circuit by way of the fourth diode.

3. A circuit arrangement according to claim 2, in which said storage capacitor is connected, at one end, to the junction of said semiconductor switch and said first inductor and, at the other end, to said deflection circuit by way of said third diode and the series combination of said second inductor and said fourth diode.

4. A circuit arrangement according to claim 3, wherein said deflection circuit further includes a d.c. blocking capacitor.

5. A circuit arrangement according to claim 4, in which the said blocking capacitor is connected, at one end, to the junction of the said first, second and third diodes and, at the other end, to said second inductor and said trace capacitor.

6. A circuit arrangement according to claims 1, 2, 3, 4 or 5, wherein the said deflection circuit is further connected to at least one auxiliary load operative to receive energy from the said deflection circuit by way of a transformer.

* * * * *

UNITED STATES PATENT AND TRADEMARK OFFICE
CERTIFICATE OF CORRECTION

PATENT NO. : 4,247,805
DATED : January 27, 1981
INVENTOR(S) : Giuseppe Zappala

It is certified that error appears in the above-identified patent and that said Letters Patent are hereby corrected as shown below:

In the drawings, sheet 2, Figure 2, the reference character "YD2" should read --VD2-- and the reference character "VD2" should read --VTR--.

Signed and Sealed this

Twenty-sixth Day of May 1981

[SEAL]

Attest:

RENE D. TEGTMEYER

Attesting Officer Acting Commissioner of Patents and Trademarks